United States Patent [19]

Kusaka

[11] Patent Number: 5,405,803

[45] Date of Patent: Apr. 11, 1995

[54] METHOD OF MANUFACTURING A SEMICONDUCTOR DEVICE

[75] Inventor: Takahisa Kusaka, Tokyo, Japan

[73] Assignee: Sony Corporation, Tokyo, Japan

[21] Appl. No.: 124,212

[22] Filed: Sep. 21, 1993

[30] Foreign Application Priority Data

Sep. 25, 1992 [JP] Japan .................................. 4-280818
Dec. 18, 1992 [JP] Japan .................................. 4-355507

[51] Int. Cl.$^6$ ............................................ H01L 21/20
[52] U.S. Cl. ........................................ 437/95; 437/97; 437/98; 437/53; 148/DIG. 60; 117/935
[58] Field of Search ........................ 437/95, 96, 97, 98; 156/612; 148/DIG. 60; 117/935

[56] References Cited

U.S. PATENT DOCUMENTS

| 4,170,501 | 10/1979 | Khajezadeh | 437/98 |
| 4,247,859 | 1/1981 | Rai-Choudhury | . |
| 4,379,726 | 4/1983 | Kumamaru et al. | 437/97 |

FOREIGN PATENT DOCUMENTS

| 84813 | 5/1985 | Japan | 148/DIG. 60 |
| 234422 | 9/1990 | Japan | 437/95 |

OTHER PUBLICATIONS

E. H. Bogardus, et al. "Gettering Technique and Structure" IBM Tech. Disc. Bulletin vol. 16, No. 4, pp. 1066–1067 (Sep. 1973).

R. S. Hockett, "Front side Gettering for N/N+(5b)" Proc. Electrochem Society 89-9 (ULSI Sci. Technol. 1989) pp. 190–203.

M. Tamura, "Interactions between Oxygen Atoms and Defects by High–Energy Ion Implantation" Defect Control in Semiconductivity vol. 1, (Dec. 1989) pp. 453–464.

Primary Examiner—R. Bruce Breneman
Assistant Examiner—Linda J. Fleck
Attorney, Agent, or Firm—Hill, Steadman & Simpson

[57] ABSTRACT

In a semiconductor device and a method of manufacturing the same according to the present invention, after As and C are introduced to a semiconductor substrate, a semiconductor layer is formed on the semiconductor substrate. When first and second semiconductor layers are to be sequentially formed on a semiconductor substrate, an impurity concentration of As or Sb serving as an impurity of the first semiconductor layer is 10 times or more an impurity concentration of the second semiconductor layer, and the second semiconductor layer has a thickness of 4 to 10 $\mu$m.

2 Claims, 2 Drawing Sheets

METHOD OF MANUFACTURING A SEMICONDUCTOR DEVICE

BACKGROUND OF THE INVENTION

1. Field of the Invention

The present invention relates to a semiconductor device having a semiconductor layer on a semiconductor substrate and a method of manufacturing the same.

2. Description of the Prior Art

Many of current semiconductor devices are manufactured using monocrystalline semiconductor substrates or epitaxial wafers each of which is obtained by growing only one epitaxial layer on a monocrystalline semiconductor substrate. In manufacturing semiconductor devices in an epitaxial wafer, since electrical active layers having a resistivity different from that of a semiconductor substrate can be formed on the semiconductor substrate, a degree of freedom of manufacturing the semiconductor device is large. Furthermore, a high-purity monocrystalline thin film having low concentrations of oxygen and carbon which cause crystal defects can be advantageously formed to have an arbitrary thickness.

For this reason, the epitaxial wafer is practically used for a high voltage semiconductor device, a bipolar integrated circuit device, a CCD or the like. When an epitaxial wafer is particularly used for a CCD, a high-resistive epitaxial layer of the same conductivity type as that of a low-resistive semiconductor substrate is formed on the semiconductor substrate, thereafter forming a CCD. Therefore, a substrate voltage serving as an electronic shutter voltage or the like can be much reduced as compared with a case wherein a CCD is formed in only a high-resistive semiconductor substrate. In the epitaxial wafer, P is conventionally doped as an impurity in the semiconductor substrate.

When a semiconductor device is formed using an epitaxial wafer obtained by sequentially stacking two epitaxial layers, i.e., a low-resistive epitaxial layer and a high-resistive epitaxial layer, on a semiconductor substrate, the semiconductor device is not theoretically limited by the characteristics of the semiconductor substrate, and nonuniformity of the impurity concentration of the semiconductor substrate is not reflected on the characteristics of the semiconductor device. For this reason, it is understood that the semiconductor wafer has an ideal structure. In the above epitaxial wafer, P is conventionally doped as an impurity in the lower epitaxial layer.

FIG. 1 shows a relationship between the thickness of an upper epitaxial layer and a shutter voltage of a CCD when the CCD is formed in an epitaxial wafer obtained by stacking two epitaxial layers on a semiconductor substrate in the same manner as described above. As is apparent from FIG. 1, unless the thickness of the upper epitaxial layer is 10 μm or less, an effect of reducing the shutter voltage cannot be obtained. The minimum thickness (i.e., 4 μm) of the upper epitaxial layer is required to form the CCD.

On the other hand, FIG. 2 shows a ratio of the impurity concentration of the lower epitaxial layer to the impurity concentration of the upper epitaxial layer when the thickness of the upper epitaxial layer is fixed to 8 μm and the impurity concentration of the upper epitaxial layer is fixed to an optimal value at which the CCD can be operated. That is, as is apparent from FIG. 2, unless the ratio of impurity concentrations is 10 or more, an effect of reducing a shutter voltage cannot be obtained.

However, the diffusion coefficient of P is large. For this reason, when the epitaxial wafer having one epitaxial layer according to the first prior art is annealed at a high temperature, P is diffused from the semiconductor substrate to the epitaxial layer, an epitaxial layer having a stable impurity concentration cannot be formed. In addition, since only one epitaxial layer is formed, the nonuniformity of the impurity concentration of the semiconductor substrate is reflected on the characteristics of the semiconductor device, and nonuniformity of an image occurs in a CCD. Therefore, in the epitaxial wafer of the first prior art, a semiconductor device having uniform characteristics cannot be formed.

When an epitaxial layer is formed on a semiconductor substrate in which As is doped as an impurity, an amount of impurity diffused from the semiconductor substrate to the epitaxial layer can be reduced, thereby obtaining an epitaxial layer having a stable impurity concentration. However, the nonuniformity of the impurity concentration of the semiconductor substrate is still reflected on the characteristics of the semiconductor device. In addition, since the toxicity of As poses a safety problem, the semiconductor substrate doped with As is less popular than a semiconductor substrate doped with P.

Since the epitaxial layer is generally contaminated with heavy metals while the epitaxial layer is grown, a generation lifetime of an electrical active layer is shortened due to contamination near the surface of the epitaxial wafer. That is, a time from generation of carriers to their recombination is 5 msec or less which is shorter than 10 msec of the semiconductor substrate which is grown by a CZ method. For this reason, a semiconductor device having excellent characteristics cannot easily be formed, and an increase in white dot or dark current is recognized in the CCD.

In the epitaxial wafer having the two epitaxial layers according to the second prior art, when the thickness of the upper epitaxial layer is decreased to 10 μm or less as described above, P is diffused in the whole upper epitaxial layer. That is, as indicated by a dotted line in FIG. 4, the resistivity begins to be decreased near the surface of the upper epitaxial layer, and a CCD cannot easily be formed on the upper epitaxial layer. In addition, heavy-metal-based contamination also occurs in the epitaxial wafer of the second prior art.

SUMMARY OF THE INVENTION

In a method of manufacturing a semiconductor device according to the present invention, since As having a small diffusion coefficient is introduced to a semiconductor substrate as an impurity, the impurity is rarely diffused from the semiconductor substrate to a semiconductor layer. For this reason, the impurity concentration of the semiconductor layer is rarely adversely affected by the impurity concentration of the semiconductor substrate, and the semiconductor layer having a stable impurity concentration can be formed. In addition, since As is introduced to the semiconductor substrate as the impurity before the semiconductor layer is formed, even when the semiconductor substrate not doped with As has a nonuniform impurity concentration, the nonuniformity of the impurity concentration can be reduced by introducing As. For this reason, the impurity concentration of the semiconductor substrate can become almost uniform. Therefore, the semiconductor device having uniform characteristics can be manufactured.

Carbon is introduced to the semiconductor substrate, and the semiconductor layer is formed on the semiconductor substrate. A gettering site is formed in the semiconductor substrate by C, heavy-metal-based contamination occurring in the step of forming the semiconductor layer is gettered from the semiconductor layer. Therefore, the semiconductor layer can have a generation lifetime equal to that of a semiconductor substrate which is grown by a CZ method, thereby manufacturing a semiconductor device having excellent characteristics.

In a semiconductor device and a method of manufacturing the same according to the present invention, since As or Sb having a small diffusion coefficient is used as an impurity in a first semiconductor layer, even when an impurity concentration of the first semiconductor layer is 10 times or more an impurity concentration of a second semiconductor layer, an impurity is rarely diffused from the first semiconductor layer to the second semiconductor layer. For this reason, the thickness of the second semiconductor layer can be set to be 4 to 10 $\mu$m, and a substrate voltage can be reduced.

When Sb is used as an impurity in the first semiconductor layer, lattice mismatching at the interface between the semiconductor substrate and the first semiconductor layer occurs, and dislocation is caused by this lattice mismatching. For this reason, the dislocation operates as a gettering site, heavy-metal-based contamination occurring in the step of forming the first and second semiconductor layers is gettered at the interface between the semiconductor substrate and the first semiconductor layer. Therefore, the first and second semiconductor layers can have a generation lifetime equal to that of a semiconductor substrate which is grown by a CZ method, thereby manufacturing a semiconductor device having excellent characteristics.

DETAILED DESCRIPTION OF THE PREFERRED EMBODIMENT

Figure 1:
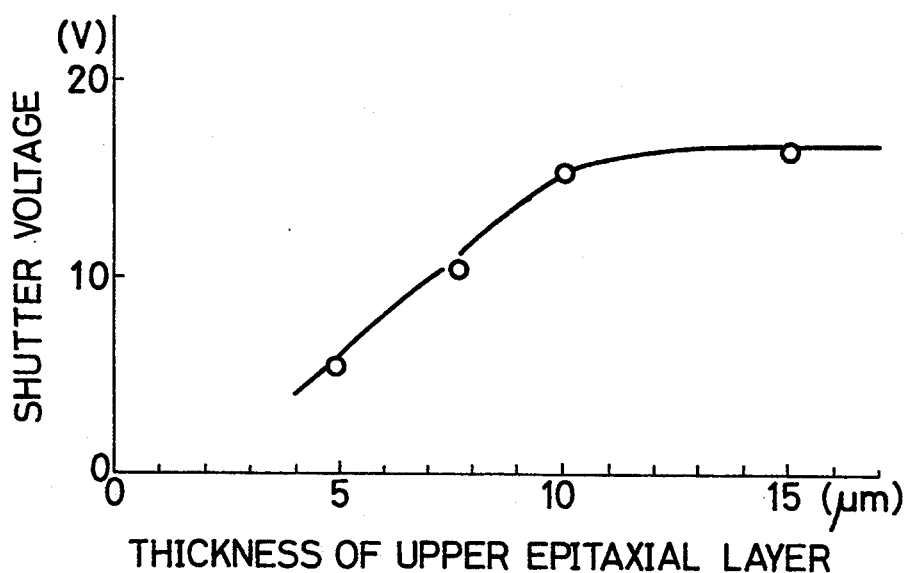
FIG. 1 is a graph showing a relationship between the thickness of an epitaxial layer and the shutter voltage of a CCD.
Figure 2:
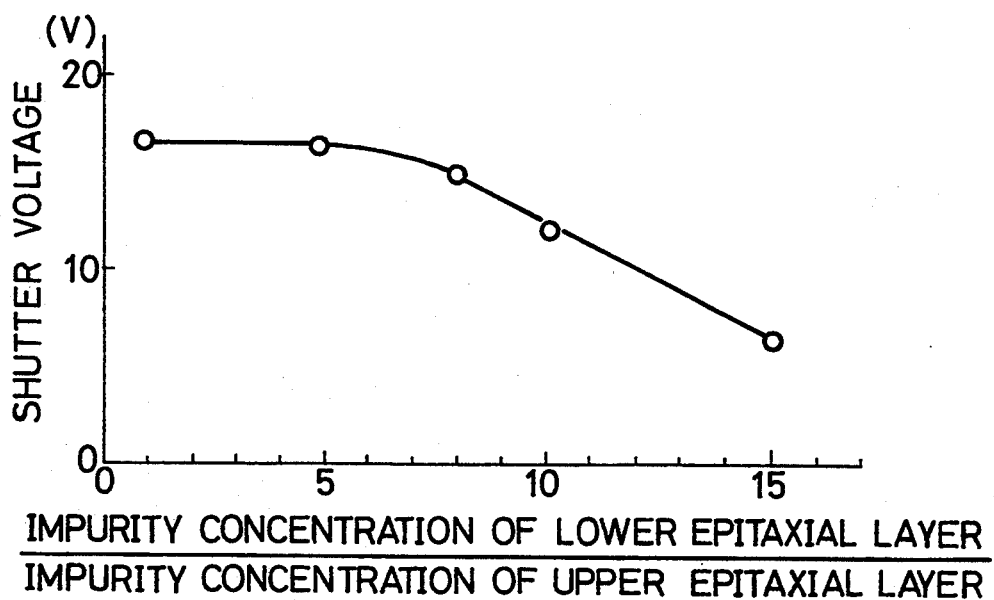
FIG. 2 is a graph showing the impurity concentration of the epitaxial layer and the shutter voltage of the CCD.
Figure 3:
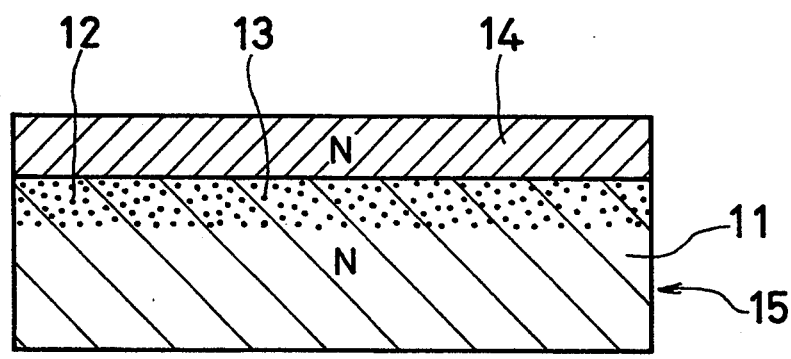
FIG. 3 is a side sectional view of an epitaxial wafer manufactured in the first embodiment of the present invention.

The first to third embodiments of the present invention will be described below with reference to FIGS. 3 and 4. FIG. 3 shows the first embodiment. In the first embodiment, an N-type Si wafer 11 grown by a CZ method and having an orientation of <100> and a resistivity of 2 to 3 $\Omega$cm is washed, dried, and then thermally oxidized to form an SiO$_2$ film (not shown) having a thickness of about 20 nm on the surface of the Si wafer 11.

Arsenic 12 is ion-implanted in the Si wafer 11 at an acceleration energy of 650 keV and a dose of $5 \times 10^{12}$ cm$^{-2}$ while channeling is prevented by the SiO$_2$ film, and carbon 13 is ion-implanted in the Si wafer 11 at an acceleration energy of 700 keV and a dose of $5 \times 10^{14}$ cm$^{-2}$. Thereafter, the SiO$_2$ film is etched by a hydrofluoric-acid-based solution.

After the Si wafer 11 is subjected to RCA washing, the Si wafer 11 is placed in an epitaxial furnace. After an atmospheric air in the epitaxial furnace is substituted with an N$_2$ gas, the N$_2$ gas is substituted with an H$_2$ gas.

Thereafter, the temperature in the epitaxial furnace is increased to 700° to 900° C., and this state is kept for a predetermined period of time. The temperature is increased to 1,150° C., a native oxide on the surface of the Si wafer 11 is removed by the H$_2$ gas, and the surface of the Si wafer 11 is shallowly etched off by an HCl gas to expose a clean surface.

The temperature in the epitaxial furnace is decreased to 1,100° C. which is an epitaxial growth temperature, and the gas in the epitaxial furnace is substituted with a source gas so as to grow an epitaxial layer 14 on the surface of the Si wafer 11. SiHCl$_3$+PH$_3$+H$_2$ is used as the source gas, and the epitaxial layer 14 is grown at a rate of about 1 $\mu$m /min to have a thickness of about 10 $\mu$m. The resistivity of the epitaxial layer 14 is about 20 to 30 $\Omega$cm.

After the epitaxial layer 14 is grown, the interior of the epitaxial furnace is naturally cooled. When the temperature in the epitaxial furnace is decreased to 200° C., the source gas left in the epitaxial furnace is substituted with an N$_2$ gas, and an epitaxial wafer 15 is unloaded from the epitaxial furnace.

In the epitaxial wafer 15 manufactured in the first embodiment as described above, the impurity ion-implanted in the Si wafer 11 located immediately under the epitaxial layer 14 is the As 12, and the diffusion coefficient of As is small. For this reason, even after the epitaxial wafer 15 is subjected to annealing, the As 12 is rarely diffused from the Si wafer 11 to the epitaxial layer 14, and the impurity concentration of the epitaxial layer 14 is stable. Therefore, a semiconductor device to be formed in the epitaxial layer 14 is not affected by the As 12.

Even when the initial impurity concentration of the Si wafer 11 is not uniform, the impurity concentration of the Si wafer 11 becomes almost uniform because the As 12 is ion-implanted at an impurity concentration higher than the initial impurity concentration. For this reason, when a CCD is formed in the epitaxial wafer 15, nonuniformity of an image rarely occurs in the CCD.

Furthermore, since the epitaxial layer 14 is formed on the Si wafer 11 after the C 13 is ion-implanted in the Si wafer 11, a gettering site is formed in the Si wafer 11 by the C 13, and heavy-metal-based contamination occurring in the step of forming the epitaxial layer 14 is gettered from the epitaxial layer 14. For this reason, the epitaxial layer 14 has a generation lifetime of 10 msec which is almost equal to that of a semiconductor substrate grown by a CZ method.

According to the first embodiment, although the above effects are obtained by the As 12 and the C 13 in the Si wafer 11, these effects can be realized by very simple steps because the As 12 and the C 13 are introduced by continuous ion-implantation.

The second embodiment will be described below. In the second embodiment, after an Si wafer grown by a CZ method and having an orientation of <100> is subjected to RCA washing, the Si wafer is placed in an epitaxial furnace. After an atmospheric air in the epitaxial furnace is substituted with an $N_2$ gas, the $N_2$ gas is substituted with an $H_2$ gas.

Thereafter, the temperature in the epitaxial furnace is increased to 700° to 900° C., and this state is kept for a predetermined period of time. The temperature is increased to 1,150° C., the native oxide on the surface of the Si wafer is removed by the $H_2$ gas, and the surface of the Si wafer is shallowly etched off by an HCl gas to expose a clean surface.

The temperature in the epitaxial furnace is decreased to 1,100° C. which is an epitaxial growth temperature, and the gas in the epitaxial furnace is substituted with a source gas so as to grow a first epitaxial layer on the surface of the Si wafer. $SiHCl_3 + AsH_3 + H_2$ is used as the source gas, and the first epitaxial layer is grown at a rate of about 1 $\mu$m/min to have a thickness of about 5 $\mu$m. The resistivity of the first epitaxial layer is about 0.1 $\Omega$cm.

After the first epitaxial layer is grown, the interior of the epitaxial furnace is naturally cooled. When the temperature in the epitaxial furnace is decreased to 200° C., the source gas left in the epitaxial furnace is substituted with an $N_2$ gas, and the Si wafer is unloaded from the epitaxial furnace.

Thereafter, after the Si wafer on which the first epitaxial layer is grown is subjected to RCA washing, the same steps as described above are repeated, thereby a second epitaxial layer is grown on the first epitaxial layer. However, in this case, $SiHCl_3 + PH_3 + H_2$ is used as a source gas, and the second epitaxial layer is grown to have a thickness of about 6 $\mu$m. The concentration of P in the second epitaxial layer is 1/10 or less the concentration of As in the first epitaxial layer. For this reason, the resistivity of the second epitaxial layer is about 10 to 20 $\Omega$cm.

Figure 4:
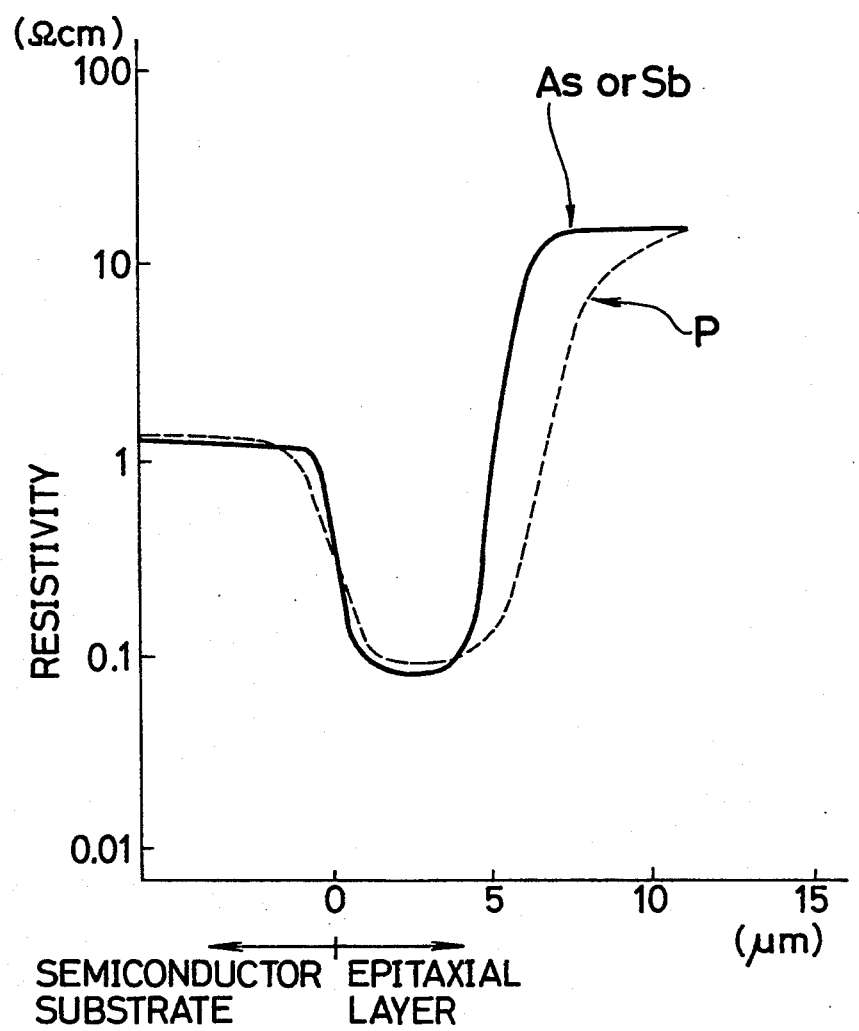
FIG. 4 is a graph showing profiles of resistivities of the second and third embodiments and the second prior art.

A solid line in FIG. 4 indicates a profile of the resistivity of the second embodiment. In the second embodiment, As is used as the impurity of the first epitaxial layer, and the diffusion coefficient of As is small. For this reason, as is apparent from FIG. 4, a profile of the resistivity at the interface between the first and second epitaxial layers, i.e., a profile of the impurity concentration at the interface, has a sharp inclination, and a region having a depth of about 4 $\mu$m from the surface of the upper epitaxial layer, i.e., the second epitaxial layer, has a constant resistivity. A semiconductor device such as a CCD can be formed in this region.

The third embodiment will be described below. In the third embodiment, a semiconductor wafer is manufactured following the same procedures as in the second embodiment except that $SiHCl_3 + SbCl_3 + H_2$ is used as a source gas for growing a first epitaxial layer, i.e., Sb is used as an impurity of the first epitaxial layer in place of As. A resistivity profile in the third embodiment is substantially the same as that in the second embodiment, as shown in FIG. 4. In the third embodiment, a generation lifetime of 10 msec which is almost equal to the generation lifetime of a semiconductor wafer grown by a CZ method can be obtained.

What is claimed is:

1. A method of manufacturing an n-type semiconductor device, comprising the steps of:

forming a first n-type semiconductor layer on an n-type semiconductor substrate, forming a second n-type semiconductor layer on said first n-type semiconductor layer, said second semiconductor layer having a thickness of about 4 to 10 micrometers, and said first semiconductor layer having an n-type impurity concentration of As or Sb of 10 times or more an n-type impurity concentration of said second semiconductor layer.

2. A method according claim 1, wherein said first and second semiconductor layers are epitaxial layers.

* * * * *